United States Patent [19]
Uchida

[11] Patent Number: 4,907,197
[45] Date of Patent: Mar. 6, 1990

[54] NON-VOLATILE SEMICONDUCTOR MEMORY DEVICE

[75] Inventor: Hidetsugu Uchida, Tokyo, Japan

[73] Assignee: Oki Electric Industry Co., Ltd., Tokyo, Japan

[21] Appl. No.: 218,303

[22] Filed: Jul. 12, 1988

[30] Foreign Application Priority Data

Jul. 13, 1987 [JP] Japan .................. 62-174543

[51] Int. Cl.⁴ .................. G11C 17/40; G11C 7/00
[52] U.S. Cl. .................. 365/185; 365/104; 357/23.5
[58] Field of Search ........... 365/185, 189, 104, 189.01; 357/23.1, 23.5, 23.6

[56] References Cited

U.S. PATENT DOCUMENTS

| | | | |
|---|---|---|---|
| 4,477,883 | 10/1984 | Wada | 365/185 |
| 4,513,397 | 4/1985 | Ipri et al. | 365/185 |
| 4,590,503 | 5/1986 | Harari et al. | 365/185 X |
| 4,608,591 | 8/1986 | Ipri et al. | 365/185 X |
| 4,752,912 | 6/1988 | Guterman | 365/185 |

OTHER PUBLICATIONS

Eeprom 1986 Nikkei Microdevices, pp. 67-79.

Primary Examiner—Stuart N. Hecker
Assistant Examiner—Alyssa H. Bowler
Attorney, Agent, or Firm—Wenderoth, Lind & Ponack

[57] ABSTRACT

A non-volatile semiconductor memory device includes a semiconductor substrate, and a source and a drain of a MOS transistor formed on one surface of the semiconductor substrate and spaced about from each other. First, second and third gates are formed on one side of the substrate through an insulating film and between the source and the drain of the MOS transistor. This memory device has one transistor construction and can be fabricated simply and finely.

9 Claims, 8 Drawing Sheets

| ERASING MODE | WRITING MODE |
|---|---|
| SELECT GATE   0V ⎍ Vpp | SELECT GATE   0V ⎍ Vpp |
| CONTROL GATE   0V ⎍ Vpp | CONTROL GATE   0V |
| SOURCE   0V | SOURCE   FLOATING |
| DRAIN   0V | DRAIN   0V ⎍ Vpp |
| SUBSTRATE ——— | SUBSTRATE ——— |

FIG. 4

| | ERASING MODE | WRITING MODE |
|---|---|---|
| SELECT GATE | 0V ⎍ $V_{PP}(+12V)$ | 0V ⎎ $-V_{PP}(-12V)$ 0V |
| INJECTION GATE | 0V ⎎ $-V_{PP}(-12V)$ | 0V ⎍ $V_{PP}(+12V)$ |
| SOURCE | 0V | 0V |
| DRAIN | 0V | 0V |
| SUBSTRATE | 0V | 0V |

NON-VOLATILE SEMICONDUCTOR MEMORY DEVICE

BACKGROUND OF THE INVENTION

1. Field of the Invention:

The present invention relates to a non-volatile semiconductor memory device having a specific type of cell construction and also to a method of writing and erasing data in the memory device.

2. Description of the Prior Art:

Non-volatile semiconductor memory devices are roughly classified into two groups: a floating gate-type EEPROM (Electrically Erasable Programmable Read Only Memory) device and a MNOS (Metal Nitride Oxide Semiconductor) EEPROM device. The floating gate-type EEPROM device has now become predominant.

Figure 2:
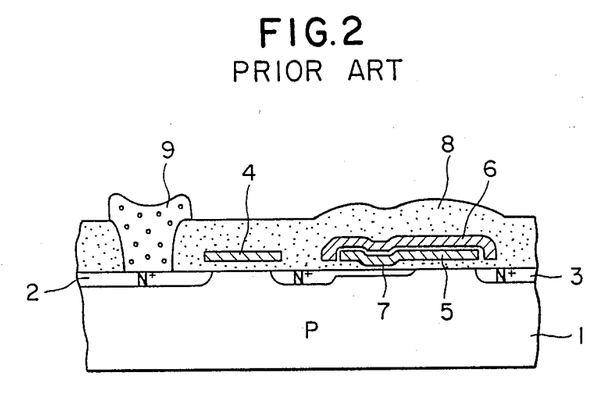
FIG. 2 is a schematic sectional view of a conventional floating gate-type EEPROM.

The floating gate-type EEPROM is described, for example, in the article, "EEPROM Starting to Change to One Transistor/Cell", in Nikkei Electronics (pp. 67 to 79, March, 1986) published by Nikkei MacGraw Hill. FIG. 2 shows one example of a known floating gate-type EEPROM.

The EEPROM has a two transistor structure. The EEPROM includes a P-type silicon substrate 1 having an N+-type drain 2 and a source 3 on the surface thereof. Further, a select gate 4 for memory cell selection, a floating gate 5 for electric charge (electron) storage and a control gate 6 are formed through an oxide film on the surface between the drain 2 and the source 3. A tunnel oxide film 7 having a thickness of 100 angstroms or less is formed between the silicon substrate 1 and the floating gate 5 so as to enhance a charge injection efficiency. An intermediate insulating film 8 is formed over the select gate 4 and the control gate 6, and an aluminum wiring layer 9 is connected to the drain 2 through a contact hole.

Figure 3:
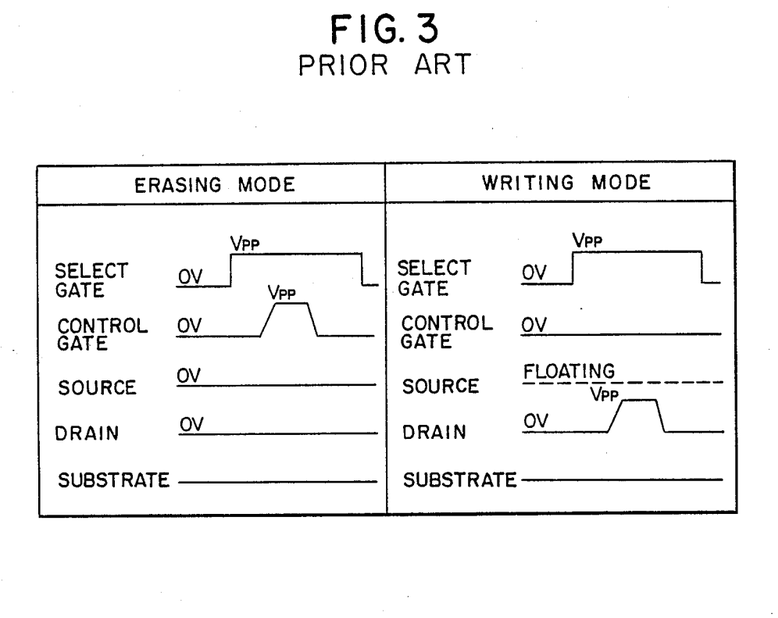
FIG. 3 is a chart showing application voltage conditions at the time of erasing and writing modes of the EEPROM of FIG. 2.

The erasing and writing modes of the prior EEPROM is explained with reference to FIG. 3, which shows voltage levels applied at the time of the erasing and writing modes. It should be noted here that the erasing mode means a state where electrons are injected into the floating gate 5 to cause a high threshold voltage and that the writing mode means a state where electrons are withdrawn from the floating gate 5 to make a low threshold voltage.

At the time of the erasing mode, a high voltage $V_{pp}$, e.g. 20 volts, is applied to both the select gate 4 and the control gate 6 so that the tunnel oxide film 7 has a high electric field. As a result, electrons are injected from the silicon substrate 1 into the floating gate 5. This flow of the electrons is a so-called Fowler-Nordheim (hereinafter referred to simply as FN) tunneling current.

At the time of the writing mode, the high voltage $GV_{pp}$, e.g. 20 volts, is applied to the select gate 4 and to the drain 2 so as to make the tunnel oxide film 7 have a high electric field. In this case, the direction of the electric field is reversed in comparison with the case of the erasing mode, so that the electrons are emitted from the floating gate 5 into the silicon substrate 1, thereby writing data. In this manner, the EEPROM can function as a non-volatile semiconductor memory device.

However, the floating gate-type EEPROM has the following problems.

(1) Since one memory cell requires two transistors, it is difficult to shrink the cell size.

(2) Since the tunnel oxide film 7 is made of a thin oxide film of 100 angstroms or less in thickness, it is difficult to control the oxide film thickness and to form a film with good electrical properties.

SUMMARY OF THE INVENTION

It is accordingly an object of the present invention to provide a non-volatile semiconductor memory device which can solve the problems of the prior art.

It is another object of the present invention to provide a non-volatile semiconductor memory device of the type which comprises a semiconductor substrate having a source and a drain of a MOS transistor whereby the difficulty of the fineness, and the difficulties in control of the thickness and properties of a tunnel oxide film can be suitably overcome.

It is a further object of the present invention to provide a non-volatile semiconductor memory device which can be made by a simple process.

The non-volatile semiconductor memory device according to the present invention comprises: a semiconductor substrate having a major surface; a plurality of memory cells each consisting of an MOS transistor formed on said semiconductor substrate, each of said MOS transistors comprising: a source formed within said substrate and adjacent to said major surface; a drain formed within said substrate and adjcent to said major surface; a channel region disposed between said source and said drain and adjacent to said major surface; a first dielectric layer formed on said major surface; a select gate form on said first dielectric layer and overlying a portion of said channel region, one end of said select gate being adjacent to said source; an injection gate formed on said first dielectric layer and overlying a portion of said channel region, one end of said injection gate being adjacent to said drain; a second dielectric layer formed on said first dielectric layer, said select gate and said injection gate; a floating gate formed on said second dielectric layer and overlying a portion of said channel region and said select gate and said injection gate so as to have a first capacitance value between said floating gate and said select gate and a second capacitance value between said floating gate and said injection gate, a middle region of said floating gate being disposed between other ends of said select gate and said injection gate, dimensions of said gates being selected such that said first capacitance value is larger than said second capacitance value; a third dielectric layer formed on said second dielectric layer and said floating gate; a first contact hole formed through said first, second and third dielectric layers so as to expose said drain; a second contact hole formed through said second and third dielectric layers so as to expose said select gate; a bit line formed on said third dielectric layer and in said first hole so as to contact said drain; and a word line formed on said third dielectric layer and in said second contact hole so as to contact said select gate.

The above and other objects, features and advantages of the present invention will become more apparent from the following description taken in conjunction with the accompanying drawings.

DESCRIPTION OF THE PREFERRED EMBODIMENT

The present invention is described with reference to the accompanying drawings and particularly, to FIG. 1.

Figure 1:
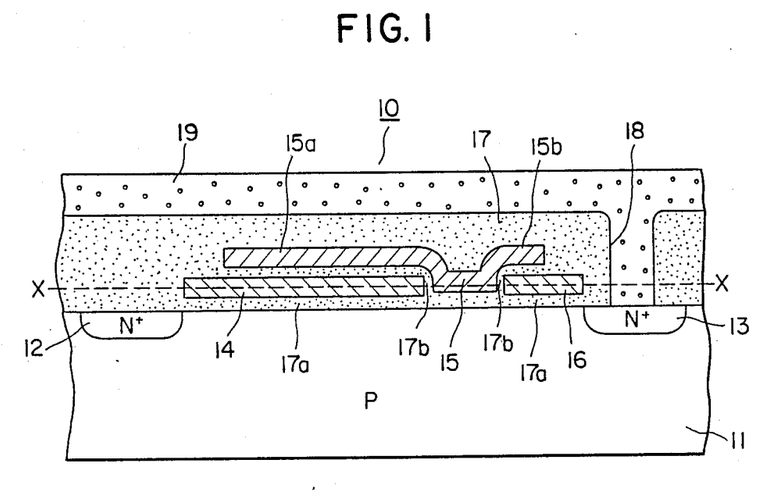
FIG. 1 is a schematic sectional view of a non-volatile semiconductor memory device according to an embodiment of the present invention.

In FIG. 1, there is sectionally shown a memory cell of a non-volatile semiconductor memory device of an embodiment of the present invention. The memory cell 10 has only one transistor. In this embodiment, a semiconductor substrate 11, for example, a P-type silicon substrate has an N+-type source 12 and a drain 13 which are separately formed on the surface thereof. A select gate 14 serving as a first gate, a floating gate 15 serving as a second gate and an injection gate 16 serving as a third gate are formed over the surface including the source 12 and the drain 13 through an insulating film 17a such as an oxide film. The floating gate 15 has one end 15a extending over at least part of the select gate 14 and another end 15b extending over at least part of the injection gate 16. An intermediate insulating film 17 such as an oxide film is further formed to cover the select gate 14, the floating gate 15 and the injection gate 16. The intermediate insulating film 17 has a contact hole 18 through which the drain 13 is connected to a bit wire 19 of an aluminum layer.

The respective gates 14, 15 and 16 are formed, for example, of a polysilicon. Preferably, the select gate 14 is approximately three times larger than the injection gate 16. The insulating film 17a formed between each of the gates 14, 15, 16 and the silicon substrate 11 has a thickness of, for example, about 500 angstroms. The spacing between the gates 14, 15 and 16 is, for example, about 200 angstroms.

A capacitance Csf between the select gate 14 and the floating gate 15a is larger than a capacitance Cif between the injection gate 16 and the floating gate 15b. In this condition, when a voltage, Vsi, is applied between the select gate 14 and the injection gate 16, a higher voltage occurs between the injection gate 16 and the floating gate 15. As a consequence, injection of electrons into or emission from the floating gate 15 invariably occurs at the side of the injection gate 16. The voltage Vif applied between the injection gate 16 and the floating gate 15 can be expressed by the following equation.

$$Vif = \frac{Csf}{Csf + Cif} \times Vsi \quad (1)$$

Figure 4:
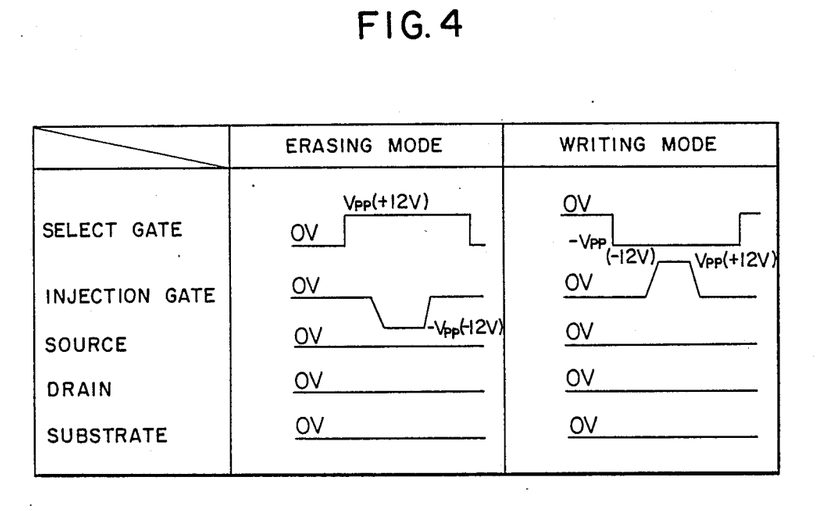
FIG. 4 is a chart showing application voltage conditions at the time of erasing and writing modes of the device of FIG. 1.
Figure 5A:
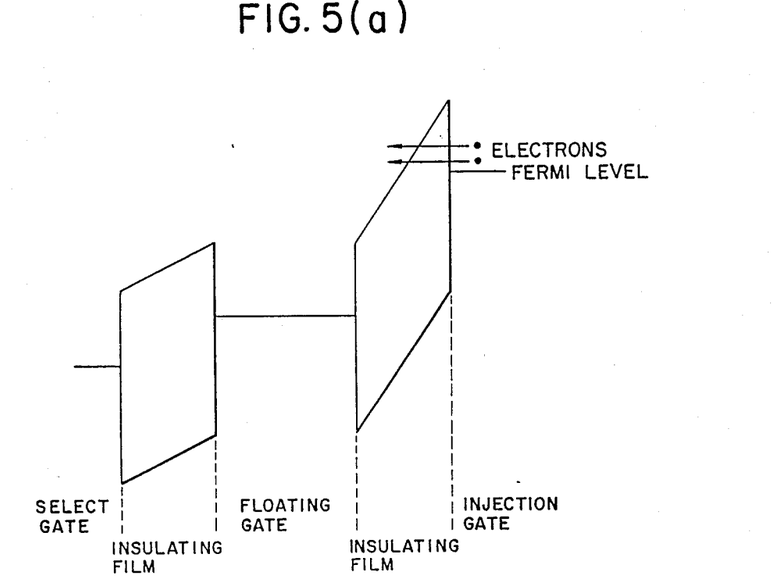
FIGS. 5(a) and 5(b) schematically show energy bands at the time of the erasing and writing modes, respectively.
Figure 5B:
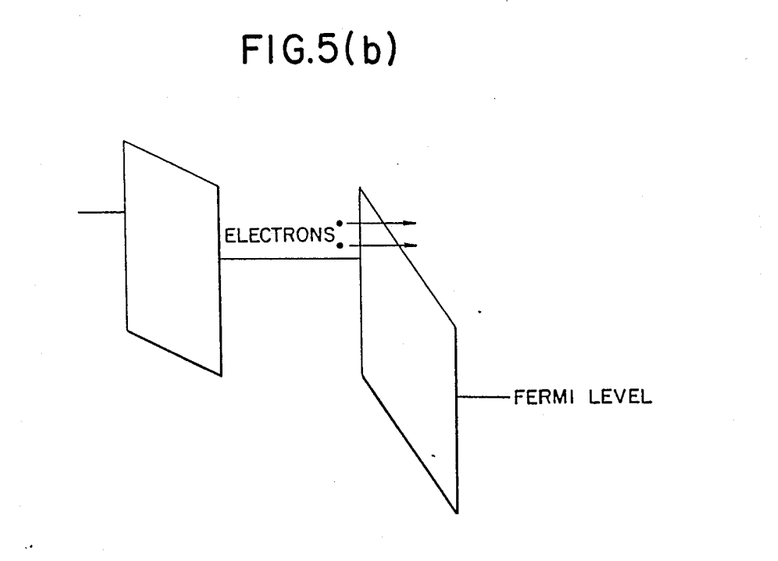

The manner of erasing and writing information is then described with reference to FIG. 4 and FIGS. 5(a) and 5(b). FIG. 4 shows application voltage conditions at the time of erasing and writing modes of the device of FIG. 1 and FIGS. 5(a) and 5(b) show energy bands of erasing and writing modes along the X—X line of FIG. 1.

When data is erased or electrons are injected into the floating gate 15, a positive voltage Vpp, e.g. 12 volts, with respect to the source 12 is applied to the select gate 14 while a negative voltage −Vpp, e.g. −12 volts, with respect to the source 12 is applied to the injection gate 16. At this time, the energy band is as shown in FIG. 5(a), so that the voltage Vif of the equation (1) is generated between the floating gate 15 and the injection gate 16, thereby injecting electrons from the injection gate 16 into the floating gate 15 due to the FN tunneling effect.

On the contrary, when information is written, a negative voltage −Vpp, e.g. −12 volts, with respect to the source 12 is applied to the select gate 14 while a positive voltage Vpp, e.g. +12 volts, with respect to the source 12 is applied to the injection gate 16. The energy band is this condition is shown n FIG. 5(b), from which it will be seen that electrons in the floating gate 15 are emitted into the injection gate 16 by the FN tunneling effect.

When the information is read out, a positive voltage of, e.g. +5 volts, with respect to the source 12 is applied to the select gate 14, the injection gate 16 and the drain 13. After the erasing operation, the electrons accumulated in the floating gate 15 induce positive holes in the channel region beneath the floating gate 15. AS a consequence, an electric current does not flow from the drain 13 to the source 12. On the other hand, after the writing where electrons are emitted from the floating gate 15, the electrons in the floating gate 15 become more deficient than in an equilibrium state. Accordingly, electrons are induced in the channel region beneath the floating gate 15, thereby permitting an electric current passing from the drain 13 to the source 12. In this manner, stored information can be read out.

Figure 6:
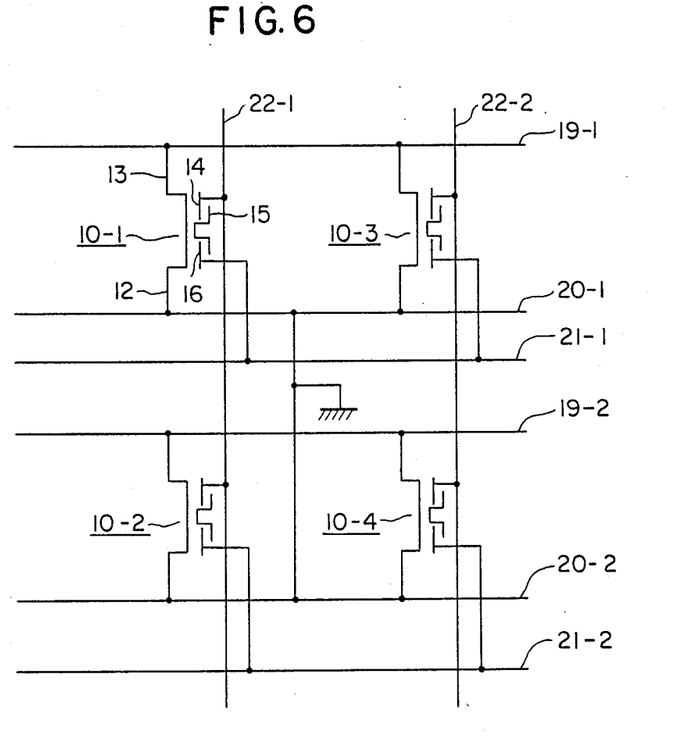
FIG. 6 is an equivalent circuit of the device of FIG. 1.

FIG. 6 shows an equivalent circuit of four bit non-volatile memory cells 10-1 to 10-4. In this equivalent circuit, the bit lines 19-1, 19-2, the source lines 20-1, 20-2 and the injection lines 21-1, 21-2 are shown as being provided in the horizontal direction. The word lines 22-1, 22-2 are shown as being provided so as to intersect the above-mentioned lines and are disposed in the vertical direction. The four bit memory cells 10-1, 10-2, 10-3 and 10-4 are connected to the intersecting points of the respective lines. In the memory cells 10-1 to 10-4, the respective sources 12 are connected through the source lines 20-1, 20-2 to a ground potential. Likewise, the drains 13 are connected to the bit lines 19-1, 19-2, the select gates 14 are connected to the word lines 22-1, 22-2, and the injection gates 6 are connected to the injection lines 21-1, 21-2.

With reference to FIG. 6, the manner of selection of, for example, the memory cell 10-1 and the manner of erasure, writing and reading of data with respect to the cell are described.

At the time of the erasing mode, a positive voltage of, e.g. +12 volts, with respect to the source 12 is applied to the word line 22-1 and a negative voltage of, e.g. −12 volts, with respect to the source 12 is applied to the injection line 21-1. The other lines are maintained at zero volts. A potential difference of 24 volts is applied between the select gate 14 and the injection gate 16. Electrons are injected from the injection gate 16 into the floating gate 15 to erase information in the memory cell 10-1. For the memory cells 10-2, 10-3, the potential difference is, e.g. 12 volts, so that electrons are not injected and thus, information is not erased. In the memory cell 10-4, no potential difference is produced, so that the erasure is not carried out.

At the time of the writing mode, a negative voltage of, e.g. −12 volts, with respect to the source 12 is applied to the word line 22-1 and a positive voltage of, e.g. 12 volts, with respect to the source 12 is applied to the injection line 21-1. The other lines are maintained at zero volts. In the memory cell 10-1 alone, there is a potential difference of 24 volts between the select gate 14 and the injection gate 16. Electrons are emitted from the floating gate 15 into the injection gate 16, thereby writing data in the memory cell 10-1. For the memory cells 10-2, 10-3 and 10-4, no information is written for the same reason as set forth with respect to the erasing mode.

At the time of the reading mode, a positive voltage of. e.g. +5 volts, with respect to the source 12 is applied to the word line 22-1, injection line 21-1 and bit line 19-1, while maintaining the other lines at zero volts. The positive voltage is applied to the select gate 14, the injection gate 16 and the drain 13 of the memory cell 10-1 alone. As a result, a drain current will flow depending upon the state of charge in the floating gate 15, making it possible to retrieve information. In the memory cell 10-2, the injection ate 16 an the drain 13 become zero volts, and the select gate 14 is held at zero volt for the memory cell 10-3. Moreover, the select gate 14, the injection gate 16 and the drain 13 are all held at zero volts for the memory cell 10-4. Accordingly, the drain current of the respective cells becomes zero irrespective of the state of charge in the respective floating gates 15, thus precluding the retrieval of data. In the above description, the cell 10-1 is selected but other cells may be selected in a similar manner.

Figure 7:
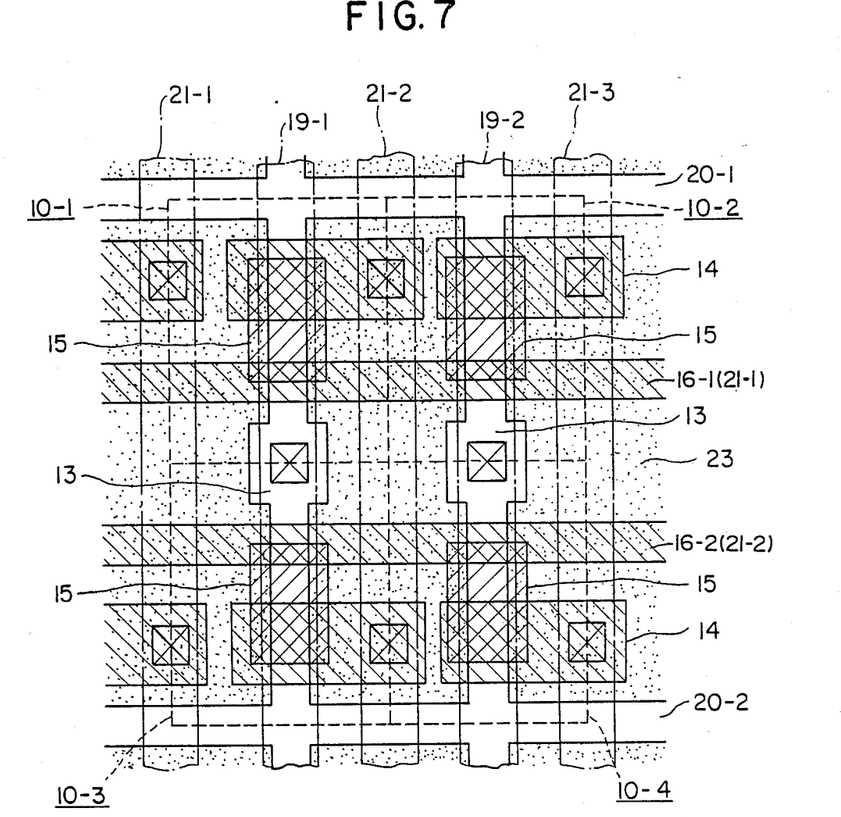
FIG. 7 is a plan view of the pattern of FIG. 6.

FIG. 7 shows a plan view of one example of a pattern of the 4-bit memory cells 10-1 to 10-4 of FIG. 6.

In this figure, four squares defined by broken lines indicate four memory cells 10-1, 10-2, 10-3 and 10-4, respectively. The floating gates 15 are superposed with the select gates 14 and the injection lines 21-1, 21-2 in such a way that the superposed area is larger for the select gates 14. The drains 13 and the select gates 14 are, respectively, connected to the bit lines 19-1, 19-2, such as Al wires, through a contact hole and the word lines 22-1, 22-2, 22-3. The injection lines 21-1, 21-2, and the select gate 14 are formed, for example, of polysilicon of the first layer simultaneously, and the floating gate 15 is formed, for example, of polysilicon of the second layer. Thus, the fabrication process is relatively simple.

FIGS. 8(a) through 8(d) and FIGS. 9(a) through 9(d) show one example of a fabrication process for the memory cells of FIG. 7. FIGS. 8(a) through 8(d) are, respectively, plan views of patterns in the respective steps and FIGS. 9(a) through 9(d) are, respectively, sectional views of the respective steps taken along the lines Y—Y of FIGS. 8(a) through 8(d). The fabrication steps are described with reference to these figures.

Figure 8A:
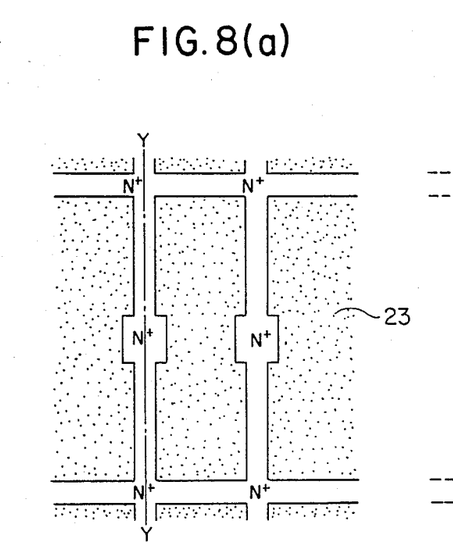
FIGS. 8(a) through 8(d) and FIGS. 9(a) through 9(d) are, respectively, manufacturing processes of the device of FIG. 7.
Figure 9A:
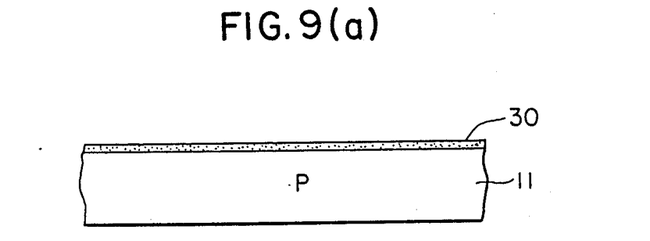

(1) Step of FIGS. 8(a) and 9(a)

After formation of a field oxide film 23 on the Ptype silicon substrate 11, gate oxidation is effected to form a gate oxide film 30 having a thickness of, for example, about 500 angstroms.

Figure 8B:
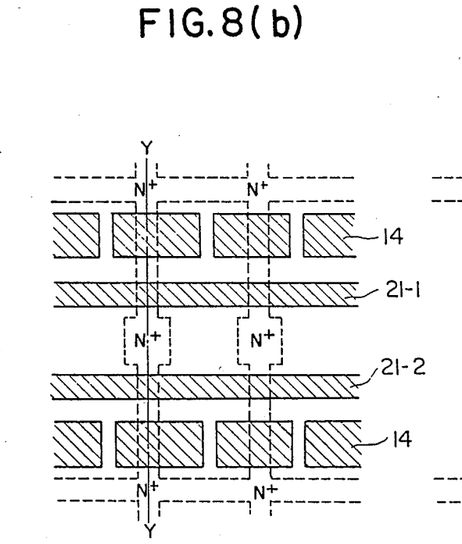
Figure 9B:
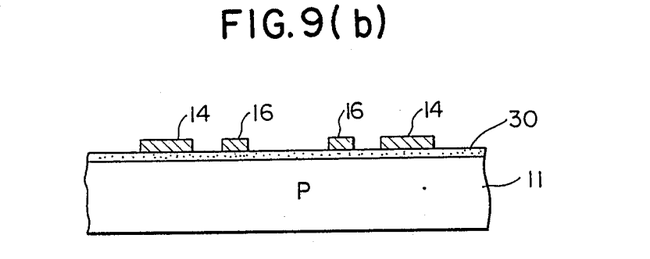

(2) Step of FIGS. 8(b) and 9(b)

Over the gate oxide film 30 is formed a first polysilicon layer, followed by diffusion of phosphorus into the polysilicon layer and patterning to form a select gate 14 and injection lines 21-1, 21-2 integrally combined with an injection gate 16.

Figure 8C:
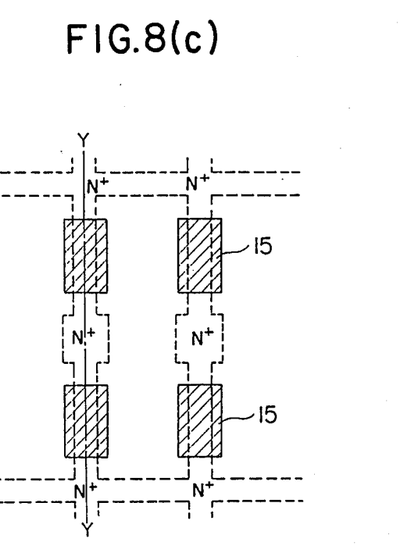
Figure 8D:
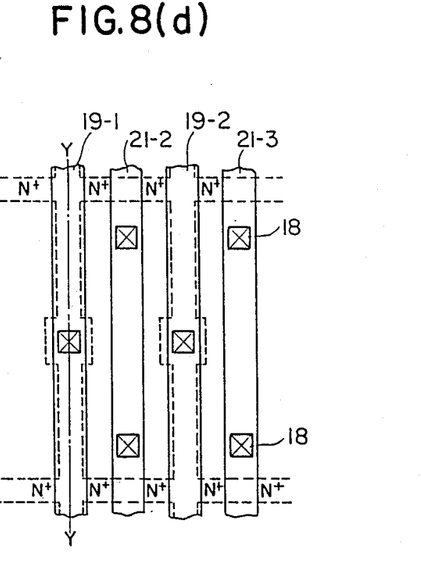
Figure 9C:
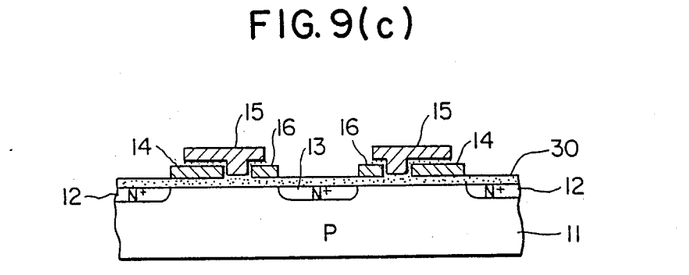
Figure 9D:
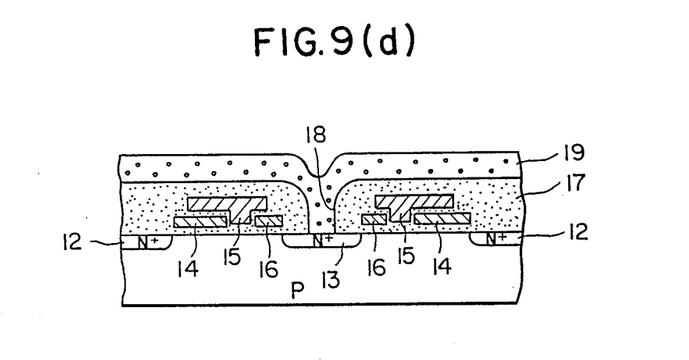

(3) Step of FIGS. 8(c) and 9(c)

After oxidation of the first polysilicon layer constituting the select gate 14, injection gate 16 and injection lines 21-1, 21-2 to form a thin oxide film having a thickness of about 200 angstroms, a second polysilicon layer is formed on the oxide film. AFter diffusion of phosphorus into the second polysilicon layer, patterning is effected to form a floating gate 15. Subsequently, an N-type impurity such as arsenic is ion-injected by self-alignment using the select gate 14, the injection gate 16 and the floating gate 15 as a mask, followed by thermal treatment of the impurity for activation to form a source 12 and a drain 13.

An intermediate insulating film 17 made, for example, of PSG is formed over the patterned surface and a contact hole 18 is formed through the intermediate insulating film 17. A metal 19 such as Al is formed on the intermediate insulating film 17 and in the contact hole 18 to connect the drain 13 and the select gate 14. The metal layer 19 is patterned to form bit lines 19, 19-1, 19-2 and word lines 21-2, 21-3, thereby obtaining the non-volatile memory cell of FIG. 7.

The memory cells according to the present invention have the following advantages.

Since the select gate 14, the floating gate 15 and the injection gate 16 are inserted between the source 12 and the drain 13, the memory cell has one transistor construction, enabling one to make a fine arrangement. Moreover, it is unnecessary to accurately form a tunnel oxide film with a thickness less than 100 angstroms as with the known floating gate-type EEPROM, so that formation of oxide films becomes simple, leading to an improved efficiency of the fabrication and a lowering of fabrication costs. The existing fabrication procedure for the known floating gate-type EEPROM can be substantially utilized without any additional step.

It will be noted that the present invention is not limited to the embodiments shown in the figures. Various variations and modifications can be made without departing from the spirit of the invention. The materials, shapes and arrangements of the select gate 14, the floating gate 15 and the injection gate 16 may be changed from those illustrated with reference to the figures. Alternatively, the semiconductor substrate may be formed of a material other than P-type silicon when the source 12 and the drain 13 are made of a material other than the P-type material.

Although the invention has been described in its preferred form with a certain degree of particularity, it is to be understood that many variations and changes are possible in the invention without departing from the scope thereof.

What is claimed is:

1. A non-volatile semiconductor memory cell consisting of an MOS transistor formed on a semiconductor substrate having a major surface, the MOS transistor comprising:

a source formed within the substrate and adjacent to the major surface of the substrate;

a drain formed within the substrate and adjacent to the major surface of the substrate;

a channel region disposed between said source and drain and adjacent to the major surface of the substrate;

a first dielectric layer formed on the major surface of the substrate;

a select gate formed on said first dielectric layer and overlying a portion of said channel region, one end of said select gate being adjacent to said source;

an injection gate formed on said first dielectric layer and overlying a portion of said channel region, one end of said injection gate being adjacent to said drain;

a second dielectric layer formed on said first dielectric layer, said select gate and said injection gate; and a floating gate formed on said second dielectric layer and overlying a portion of said channel region and said select gate and said injection gate so as to have a first capacitance value between said floating gate and said select gate and a second capacitance value between said floating gate and said injection gate, a middle region of said floating gate being diposed between other ends of said select gate and said injection gate, dimensions of said gates being selected such that said first capacitance value is larger tan said second capacitance value.

2. A non-volatile semiconductor memory cell according to claim 1, wherein said select gate and injection gate are formed of polysilicon.

3. A non-volatile semiconductor memory cell according to claim 1, wherein said second dielectric layer s formed of polysilicon oxide.

4. A non-volatile semiconductor memory device comprising:
a semiconductor substrate having a major surface;
a plurality of memory cells each consisting of an MOS transistor formed on said semiconductor substrate, each of said MOS transistors comprising:
a source formed within said substrate and adjacent to said major surface;
a drain formed within said substrate and adjacent to said major surface;
a channel region disposed between said source and said drain and adjcent to said major surface;
a first dielectric layer formed on said major surface;
a select gate formed on said first dielectric layer and overlying a portion of said channel region, one end of said select gate being adjacent to said source;
an injection gate formed on said first dielectric layer and overlying a portion of said channel region, one end of said injection gate being adjacent to said drain;

a second dielectric layer formed on said first dielectric layer, said select gate and said injection gate;

a floating gate formed on said second dielectric layer and overlying a portion of said channel region and said select gate and said injection gate so as to have a first capacitance value between said floating gate and said select gate and a second capacitance value between said floating gate and said injection gate, a middle region of said floating gate being disposed between other ends of said select gate and said injection gate, dimensions of said gates being selected such that said first capacitance value is larger than said second capacitance value;

a third dielectric layer formed on said second dielectric layer and said floating gate;

a first contact hole formed through said first, second and third dielectric layers so as to expose said drain;

a second contact hole formed through said second and third dielectric layers so as to expose said select gate;

a bit line formed on said third dielectric layer and in said first hole so as to contact said drain; and a word line formed on said third dielectric layer and in said second contact hole so as to contact said select gate.

5. A non-volatile semiconductor memory device according to claim 4, wherein said plurality memory cells are arranged in a matrix form.

6. A non-volatile semiconductor memory device according to claim 4, wherein each of said injection gates are arranged in a first direction and are formed as a line electrode layer.

7. A non-volatile semiconductor memory device according to claim 6, wherein each of said bit lines and word lines are arranged in a second direction which is different from said first direction.

8. A non-volatile semiconductor memory device according to claim 4, wherein said select gates and injection gates are formed of polysilicon.

9. A non-volatile semiconductor memory device according to claim 4, wherein said second dielectric layer is formed of polysilicon oxide.

* * * * *